United States Patent
Hébert

(10) Patent No.: US 6,437,416 B1
(45) Date of Patent: Aug. 20, 2002

(54) SEMICONDUCTOR STRUCTURE HAVING A PLANAR JUNCTION TERMINATION WITH HIGH BREAKDOWN VOLTAGE AND LOW PARASITIC CAPACITANCE

(75) Inventor: Francois Hébert, Sunnyvale, CA (US)

(73) Assignee: Cree Microwave, Inc., Sunnyvale, CA (US)

( * ) Notice: Subject to any disclaimer, the term of this patent is extended or adjusted under 35 U.S.C. 154(b) by 0 days.

(21) Appl. No.: 08/634,310

(22) Filed: Apr. 12, 1996

(51) Int. Cl.⁷ .................................. H01L 29/47
(52) U.S. Cl. ................ 257/488; 257/333; 257/339; 257/389; 257/409; 257/395; 257/587; 257/588
(58) Field of Search .................. 257/395, 396, 257/501, 506, 508, 509, 514, 488, 511, 517, 507, 370, 587, 588, 333, 339, 389, 409, 305

(56) References Cited

U.S. PATENT DOCUMENTS

| | | | | |
|---|---|---|---|---|
| 4,778,774 A | * | 10/1988 | Blossfield | 257/507 |
| 5,442,226 A | * | 8/1995 | Maeda et al. | 257/588 |
| 5,469,383 A | * | 11/1995 | McElroy et al. | 257/396 |
| 5,525,833 A | * | 6/1996 | Jang | 257/588 |
| 5,541,120 A | * | 7/1996 | Robinson et al. | 257/511 |

FOREIGN PATENT DOCUMENTS

| | | | | |
|---|---|---|---|---|
| JP | 56-35462 | * | 4/1981 | |
| JP | 61-164265 | * | 7/1986 | 257/509 |

OTHER PUBLICATIONS

High Speed Static Programmable Topic Array in LOCO-MOS IEEE Journal of Solid–State Circuits, vol. SC–11, #3, Jun. 76, May et al. Silicon Processing, vol. 1 S. Wolf et al.* Silicon Processing for VLSI Era, V. 2, S. Wolf et al. High Speed Static Programmable Logic Array in Loc Mos. IEEE Journal of Solid State Circuits, vol. SC–11, No. 3, 76, 1990.*

* cited by examiner

Primary Examiner—Nathan Flynn
(74) Attorney, Agent, or Firm—Townsend and Townsend and Crew LLP; Henry K. Woodward

(57) ABSTRACT

The breakdown voltage of a semiconductor device, such as a transistor fabricated in a device region in and abutting the surface of a semiconductor body with a field oxide surrounding the device region, is improved by etching the field oxide abutting the device region to reduce the thickness thereof to about 0.6–1.4 μm and then forming a field plate in the recessed field oxide which is capacitively coupled to the underlying semiconductor body. The field plate can be floating, connected to a voltage potential, or connected to the semiconductor device.

9 Claims, 7 Drawing Sheets

SEMICONDUCTOR STRUCTURE HAVING A PLANAR JUNCTION TERMINATION WITH HIGH BREAKDOWN VOLTAGE AND LOW PARASITIC CAPACITANCE

BACKGROUND OF THE INVENTION

This invention relates generally to semiconductor devices, and more particularly the invention relates to high frequency (RF and microwave) power transistors and the improvement of breakdown voltage of such devices.

Power transistors and diodes are typically fabricated in a device region in a semiconductor substrate with the device region surrounded by a thick field oxide which functions as a junction termination. See FIG. 1 which illustrates in section a base region 10 of a bipolar transistor in a silicon substrate 12 and surrounded by field oxide 14. The breakdown voltage (BV) is limited by peripheral effects including curvature of the PN junction separating the base and collector due to dopant suck-up (boron for an NPN transistor base) in the field oxide and diffusion into the silicon. The oxide/silicon interface charge typically results in reduced breakdown for the NPN transistor.

FIG. 2 illustrates a modification of the structure in FIG. 1 in which a deep extrinsic base extension 11 is formed to provide a radius of curvature sufficient to maintain the required collector-base junction. Formation of the deep extrinsic base extension does require additional processing in masking, dopant implanting, and drive-in. Further, the structure still remains sensitive to oxide/silicon fixed charge and boron suck-up into the field oxide (NPN transistor). Additionally, higher device capacitance results due to increased depth and lateral dimensions of the base region.

FIG. 3 illustrates another modification which employs a lightly doped junction extension 11 around the perimeter. Again, the junction extension requires additional processing including masking, implant, and high temperature drive-in. The increased junction area results in higher device capacitance due to the increased lateral dimensions of the collector base junction.

FIG. 4 illustrates in section a fully oxide walled junction transistor which has increased breakdown voltage due to the improved electric field distribution therein. Device capacitance is minimized due to no lateral encroachment in the collector base PN junction. However, again complex processing requiring chemical-mechanical polishing, deposited conformal oxides, isotropic etching, and planarization are required.

FIG. 5 illustrates in section another prior art structure which utilizes a field plate 18 overlying the field oxide 14 and positioned around the device region in contact with the base 10. The field plate is capacitively coupled to the underlying semiconductor wafer 12 and functions as a capacitor between the base and collector of the transistor. The capacitor tends to maintain the PN junction between the base and collector by repelling electrons from the collector region (for an NPN transistor). However, the thickness of the field oxide limits the capacitance and the effect thereof in increasing breakdown voltage.

Accordingly, there is a need for a simple, low cost method and structure for increasing the junction breakdown voltage of a semiconductor device, especially for an RF and microwave power transistor, which minimizes any increase in junction capacitance.

SUMMARY OF THE INVENTION

Briefly, a method and resulting structure is provided for improving breakdown voltage without adversely affecting device capacitance by fabricating a semiconductor device in a device region in and abutting the surface of a semiconductor body such as a silicon substrate. The device region is surrounded by field oxide on the surface. In accordance with the invention, the field oxide abutting the device region is thinned such as by etching which forms a recessed area in the field oxide. Preferably, the remaining field oxide of the recessed area is approximately 0.6–1.4 μm in thickness. A field plate is then formed over the recessed area which is capacitively coupled to the underlying semiconductor body. The field plate can be electrically connected to the base or emitter of a bipolar transistor or to the source or gate of a field effect transistor. For an N channel field effect transistor or an NPN bipolar transistor, this places the field plate at a lower voltage than the collector (drain) of the transistor thus repelling electrons at the collector-base drain-channel PN junction. For PNP bipolar transistors or P-channel field effect transistors, the field plate will be at a higher voltage to repel hole carriers in the substrate at the collector base junction. Alternatively, the field plate can be connected to a voltage potential (e.g., ground) or left floating or disconnected.

The process is compatible with the use of thick field oxides, and the resulting structure minimizes parasitic capacitance by permitting the use of thick field oxides while minimizing the field plate parasitic capacitance when left floating. Moreover, the processing is simple since the recess oxide etch is self-aligned to the active device region with the field plate consisting of polysilicon or metal electrodes.

The invention and objects and features thereof will be more readily apparent from the following detailed description and appended claims when taken with the drawing.

BRIEF DESCRIPTION OP THE DRAWINGS

DETAILED DESCRIPTION OF ILLUSTRATIVE EMBODIMENTS

Figure 1:
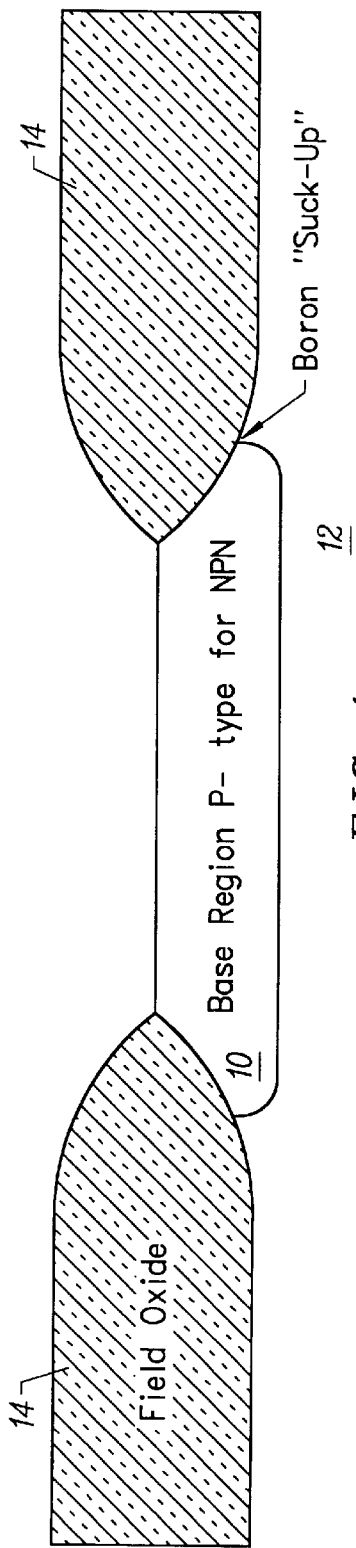
FIGS. 1–5 are section views of prior art semiconductor devices including thick field oxides (locos) used as a junction termination.
Figure 2:
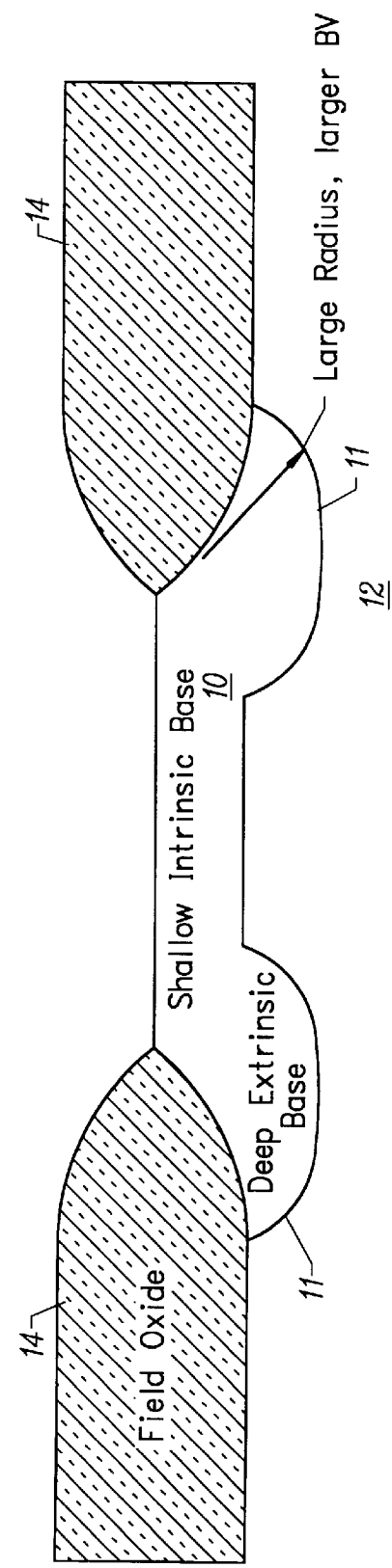
Figure 3:
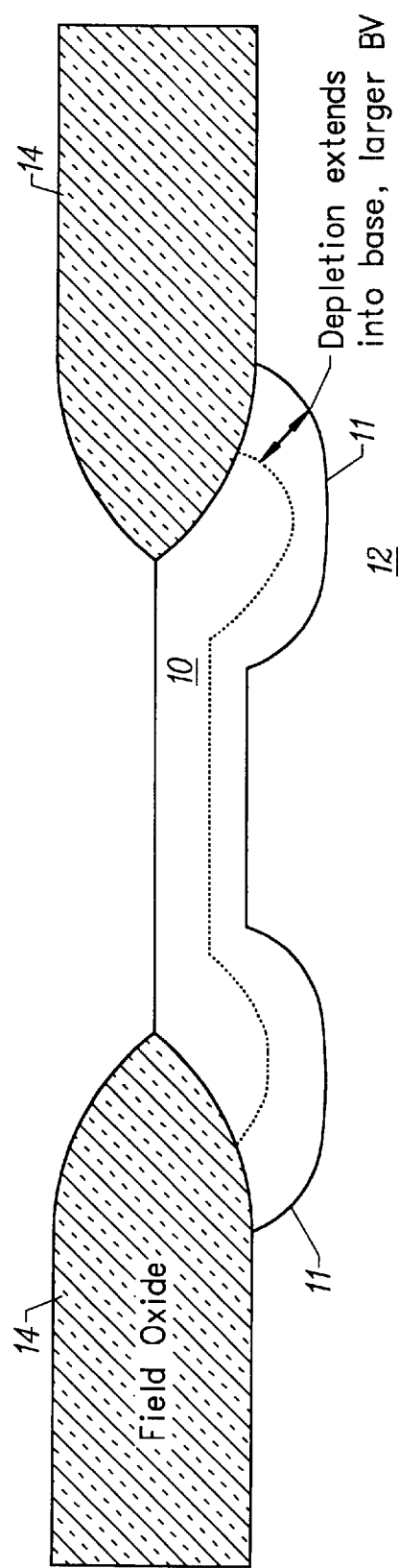
Figure 4:
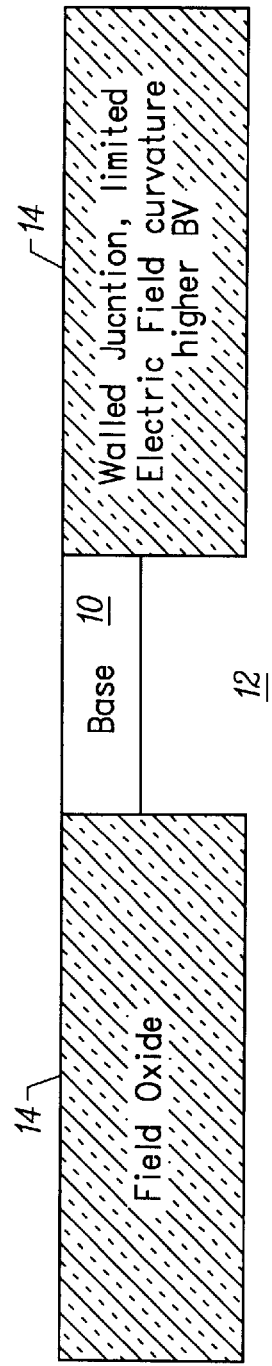
Figure 5:
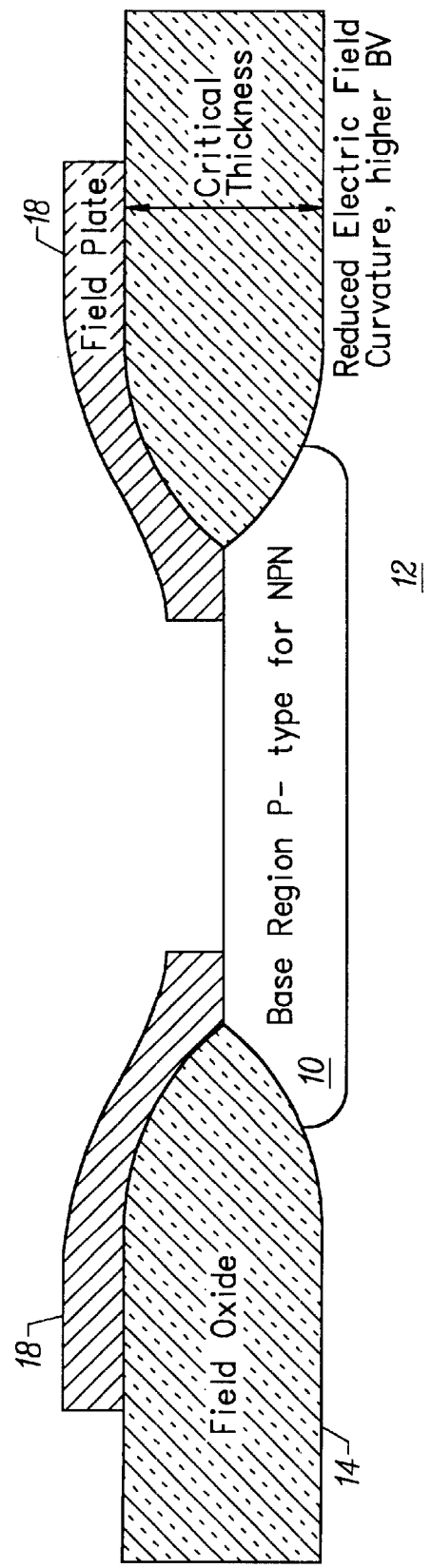
Figure 6A:
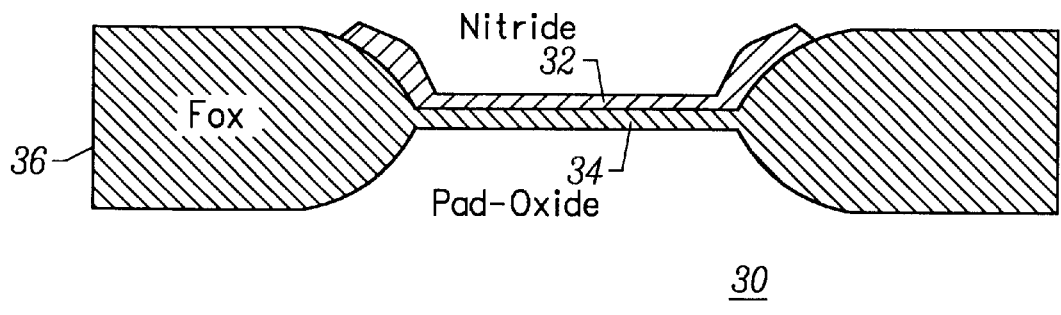
FIGS. 6A–6E are side views in section illustrating steps in fabricating a high breakdown voltage and low parasitic capacitance semiconductor device in accordance with one embodiment of the invention.

FIGS. 6A–6E illustrate steps in fabricating a bipolar transistor with high breakdown voltage and low parasitic capacitance in accordance with one embodiment of the invention. In FIG. 6A the device region in a silicon substrate 30 is defined by depositing a silicon nitride layer 32 over an oxide layer 34 on the surface of the substrate 30 and then a field oxide 36 is formed by the thermal oxidation of the exposed silicon substrate surface in accordance with conventional locos processing. The pad oxide 34 will have a thickness on the order of 200–1200 Å, the nitride thickness is 200–1600 Å, and the field oxide is greater than 1.3 μm in thickness.

Figure 6B:
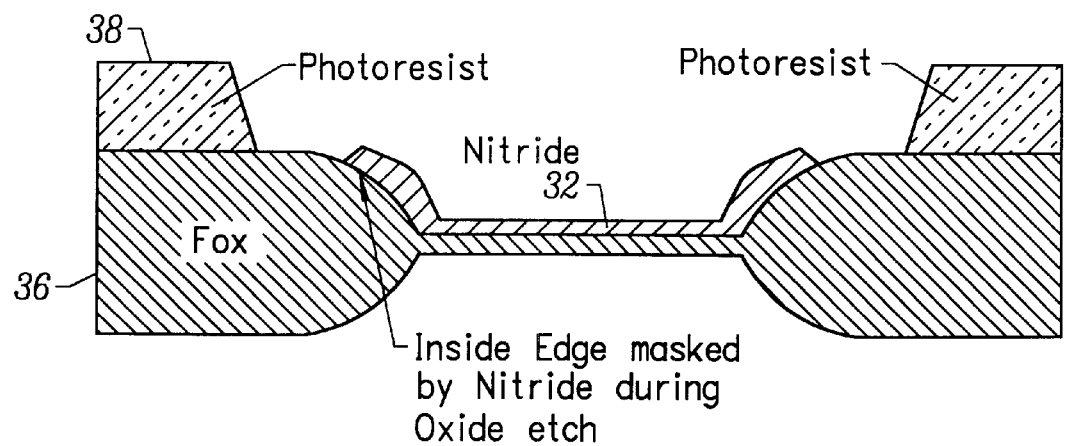

Thereafter, in FIG. 6B the nitride layer 32 remains over the device region as an etchant mask, and a photoresist mask 38 is formed to expose a portion of the field oxide 36 abutting and surrounding nitride 32. The photoresist can be a ring which surrounds the active device area (with photoresist positioned over the nitride) or simply an oversized version of the active device area mask as shown in FIG. 6B. In either step, self-alignment is obtained by the presence of the nitride 32 as a mask for the inside edge of the recessed region of the field oxide, which is the critical location in the resulting device structure.

Figure 6C:
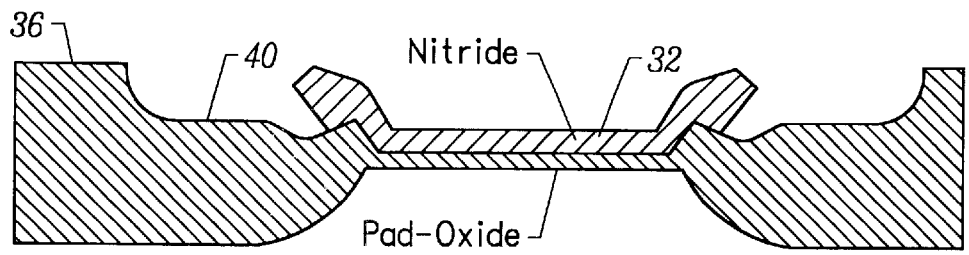
Figure 6D:
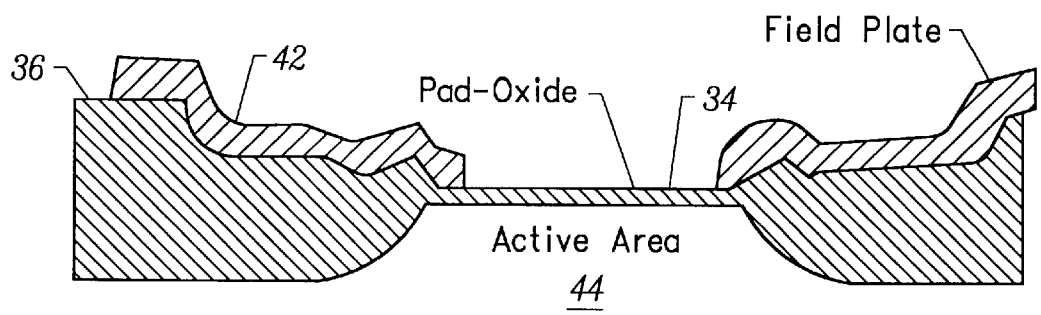

As shown in FIG. 6C the exposed field oxide is thinned by applying an oxide etch, either wet or dry etch, such that the thickness of the exposed field oxide 40 is reduced to approximately 0.6–1.4 μm. Hydrofluoric acid diluted in water is a known wet oxide etch, and plasma or reactive ion are known dry enchants. Thereafter as shown in FIG. 6D, the nitride 32 is removed by preferential etchant, and a field plate 42 is formed in the recessed portion 40 of the field oxide, and in this embodiment overlaps the unetched field oxide 36 and a portion of the active device area 44 which was protected by the nitride layer 32. A polysilicon field plate 42 can be formed by using the same polysilicon as used for polysilicon resistors and polysilicon emitters. The pad oxide 34 overlying the active area 44 can be used as an etch stop layer for the polysilicon field plate. Alternatively, the field plate can be formed by silicided polysilicon, doped silicon, doped amorphous silicon, doped polysilicon, metal silicide, or standard metals such as aluminum, titanium tungsten, tungsten, gold, or combinations thereof. It should also be noted that the process of thinning the field oxide around the periphery of the active area can be used to increase the efficacy of field plates made with interconnect metal and compensate for a thick intermetal dielectric film. For example, in a typical BICMOS process a field oxide of less than 1 μm in thickness is used, but before the metal 1 deposition, a 0.5 μm or thicker dielectric is used to planarize the surface.

Figure 6E:
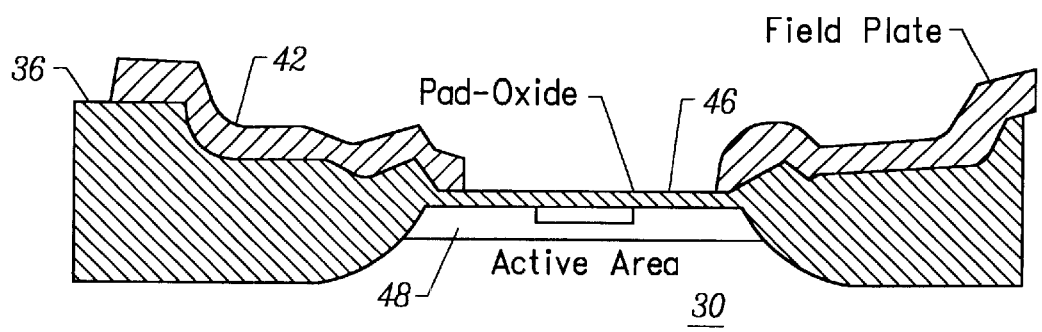

FIG. 6E represents a completed NPN bipolar transistor including an emitter 46, base 48, and the substrate 30 functioning as the collector. The field plate is left floating (disconnected from the transistor), but as will be described further hereinbelow the field plate can be connected to the emitter 44, base 46, or to a voltage potential including ground.

Figure 7A:
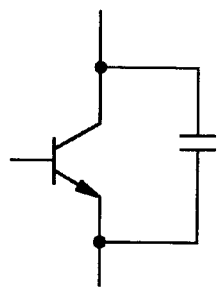
FIGS. 7A–7C are electrical schematics of an NPN transistor in accordance with the invention.
Figure 7A:
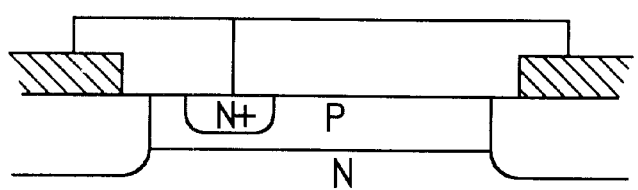
Figure 7B:
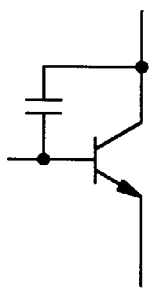
Figure 7B:
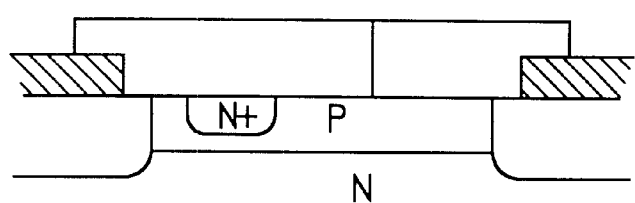
Figure 7C:
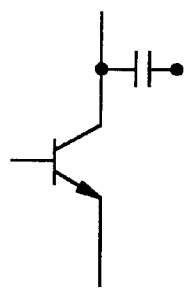
Figure 7C:
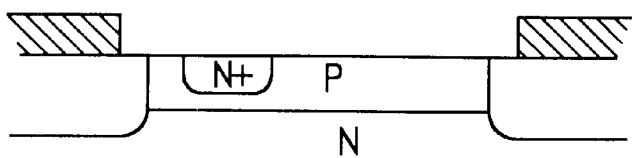
Figure 8A:
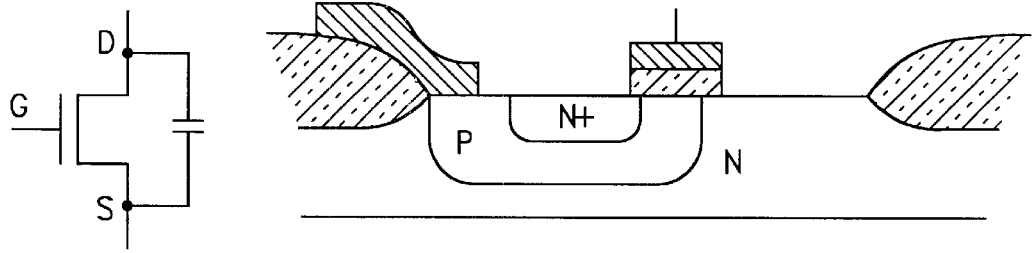
FIGS. 8A–8C are schematic diagrams of an N-channel DMOS field effect transistor in accordance with the invention.
Figure 8B:
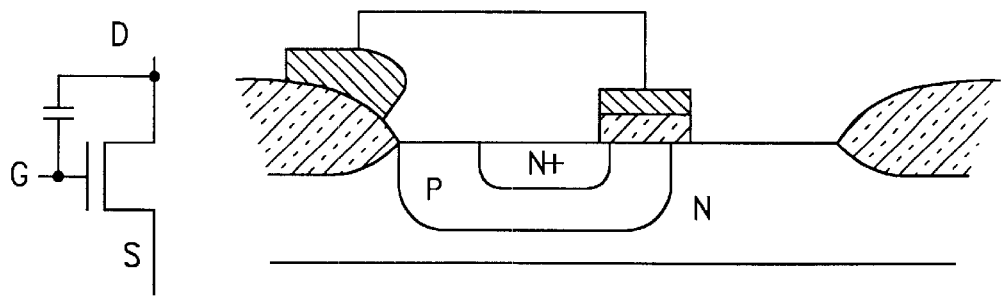
Figure 8C:
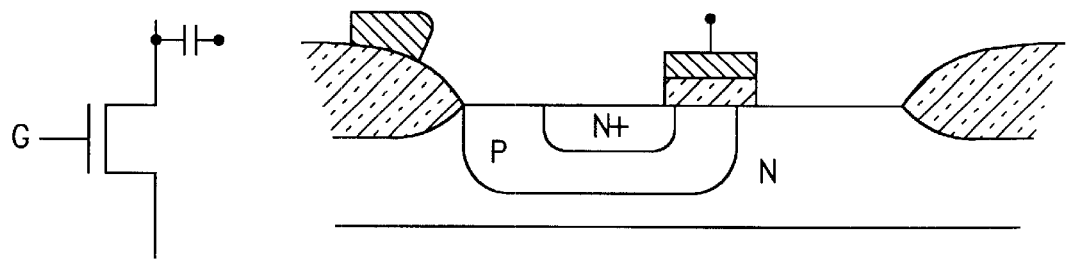

FIGS. 7A–7C are electrical schematics and section views of three embodiments of an NPN bipolar transistor with the recessed field plate, in which the field plate is electrically connected to the emitter (FIG. 7A) to the base (FIG. 7B), or left floating (FIG. 7C). Similarly, FIGS. 8A–8C are electrical schematics and section views of an N-channel field effect transistor in which the recessed field plate is electrically connected to the source (FIG. 8A) to the gate (FIG. 8B), and left floating (FIG. 8C).

Simulations using Medici have evaluated the critical design rules and sensitivities of the process in accordance with the invention. As long as the thickness of the recessed oxide is in the range of approximately 0.6–1.4 μm, enhancement of breakdown voltage is obtained. If there is no oxide recess, the field plate does not result in increased breakdown voltage if the field oxide thickness is greater than approximately 1.6 μm. Field plate overlap and alignment with the unrecessed field oxide and the device region is not critical if the plate edge is within the active base edge ±0.5 μm and the field plate has a width approximately equal to the depletion width in the underlying substrate at breakdown. The recess region width should be approximately the depletion width at breakdown.

Preliminary experimental data for a diode in the device region surrounded by field oxide was approximately 48 volts at 100 microamperes. By employing a floating field plate with no recess of the field oxide, the breakdown voltage was increased slightly to 50 volts at 100 microamperes. However, in a similar structure in which the field oxide was recessed to a thickness of 0.8 μm, a floating plate on the recessed region increased the breakdown voltage to approximately 60 volts at 100 microamperes.

The described invention provides a structure and method of increasing the breakdown voltage of planar junctions for silicon devices which are compatible with the use of thick field oxides. The process minimizes parasitic capacitance by permitting the use of thick field oxides and minimizing the field plate parasitic capacitance when left floating. Moreover, the processing is simple since the recess oxide etch is self-aligned to the active device area and the field plate can comprise polysilicon or metal electrodes formed concurrently with other polysilicon and metal processing steps.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A semiconductor device having increased breakdown voltage comprising:
    a semiconductor body having a surface region of one conductive-type abutting a surface of said semiconductor body,
    a device region formed in said surface region of opposite conductive-type, said device region abutting said surface,
    a field oxide on said surface and surrounding said device region, said field oxide including a recessed portion of reduced thickness in the range of about 0.6–1.4 μm adjacent to said device region,
    a device within said device region having a p-n junction which terminates under said recessed portion of said field oxide, and
    a conductive plate on said recessed portion capacitively coupled to said semiconductor body for enhancing breakdown voltage of said p-n junction during device operation.
        said conductive plate having a width at least equal to a depletion region width in said semiconductor body under said conductive plate at breakdown voltage of a device in said device region.

2. The semiconductor device as defined by claim 1 wherein said conductive plate comprises material selected from the group consisting of doped silicon, silicided polysilicon, doped polysilicon, metal silicide, and metal.

3. The semiconductor device as defined by claim 1 wherein said conductive plate overlaps said device region.

4. The semiconductor device as defined by claim 1 wherein said region includes an emitter and a base of a bipolar transistor, said conductive plate contacting said emitter.

5. The semiconductor device as defined by claim 1 wherein said device region includes an emitter and a base of a bipolar transistor, said conductive plate contacting said base.

6. The semiconductor device as defined by claim 1 wherein said device region includes a source and a gate of a field effect transistor, said conductive plate contacting said gate.

7. The semiconductor device as defined by claim 1 wherein said conductive plate is disconnected from a device in said device region.

8. The semiconductor device as defined by claim 7 wherein said conductive plate is connected to a voltage potential.

9. The semiconductor device as defined by claim 1 wherein said conductive plate overlaps said field oxide adjacent to said recessed portion.

* * * * *